United States Patent

Yoshida et al.

[11] Patent Number: 5,471,141
[45] Date of Patent: Nov. 28, 1995

[54] METHOD AND APPARATUS FOR REGULATING RADIO FREQUENCY PULSE

[75] Inventors: Makoto Yoshida; Naoki Satoh, both of Katsuta; Hidehiko Asoh, Mito; Tuyosi Shudo, Katsuta; Ryuzaburo Takeda, Mito; Jun'ichi Taguchi, Yokohama, all of Japan

[73] Assignees: Hitachi, Ltd.; Hitachi Instrument Engineering Co., Ltd., both of Tokyo, Japan

[21] Appl. No.: 376,085

[22] Filed: Jan. 20, 1995

Related U.S. Application Data

[63] Continuation of Ser. No. 131,570, Oct. 4, 1993, abandoned, which is a continuation of Ser. No. 696,640, May 7, 1991, abandoned.

[30] Foreign Application Priority Data

May 7, 1990 [JP] Japan ..................... 2-115766

[51] Int. Cl.⁶ .................... G01R 33/48
[52] U.S. Cl. .................... 324/314; 324/309
[58] Field of Search .................... 324/313, 314, 324/307, 309, 318, 300; 128/653.2

[56] References Cited

U.S. PATENT DOCUMENTS

| | | | |
|---|---|---|---|
| 4,506,223 | 3/1985 | Bottomley et al. | 324/309 |
| 4,531,094 | 7/1985 | Ordidge et al. | 324/307 |
| 4,543,529 | 10/1985 | Mee et al. | 324/314 |
| 4,549,137 | 10/1985 | Suzuki et al. | 324/314 |
| 4,577,152 | 3/1986 | Macovski | 324/313 |
| 4,694,254 | 9/1987 | Vatis et al. | 324/313 |
| 4,739,267 | 4/1988 | Leroux et al. | 324/314 |
| 4,788,501 | 11/1988 | Leroux et al. | 324/314 |
| 4,799,014 | 1/1989 | Nakabayashi | 324/313 |
| 4,806,866 | 2/1989 | Maier | 324/313 |
| 4,855,679 | 8/1989 | Granot | 324/309 |
| 4,866,386 | 9/1989 | Sattin | 324/314 |
| 4,878,021 | 10/1989 | Granot | 324/309 |
| 5,107,215 | 4/1992 | Schaefer et al. | 324/314 |
| 5,117,187 | 5/1992 | Granot | 324/309 |
| 5,124,650 | 6/1992 | Granot | 324/309 |
| 5,126,673 | 6/1992 | Hennig | 324/309 |

FOREIGN PATENT DOCUMENTS 61-191949  8/1986  Japan ..................... G01N 24/08

*Primary Examiner*—Sandra L. O'Shea
*Assistant Examiner*—Raymond Y. Mah
*Attorney, Agent, or Firm*—Antonelli, Terry, Stout & Kraus

[57] ABSTRACT

When image information obtained on the basis of an NMR signal, e.g. MRI, is acquired, a radio frequency pulse is set so that a strong signal can be obtained particularly from a portion of interest among the sample. To accomplish this object, the occurrence of signals from portions of the sample other than the selected portion of interest is inhibited in advance of obtaining information (an image) of the sample. Various radio frequency pulses are then irradiated to the sample and a suitable radio frequency pulse is determined on the basis of the resulting signal.

14 Claims, 6 Drawing Sheets

METHOD AND APPARATUS FOR REGULATING RADIO FREQUENCY PULSE

This application is a continuation of application Ser. No. 08/131,570, filed Oct. 4, 1993, abandoned which is a continuation of application Ser. No. 07/696,640, filed May 7, 1991 abandoned.

BACKGROUND OF THE INVENTION

This invention relates to a method and apparatus for regulating a radio frequency pulse.

When magnetic resonance imaging is carried out, a flip angle of a spin becomes different even when the same radio frequency pulse (rf pulse) is used because the Q value of a reception coil system varies depending on the attributes of a subject (such as the shape) as a sample. To solve this problem, the technology for optimizing the amplitude, that is, power, of the rf pulse in such a manner as to obtain the same flip angle of the spin even when the attributes of the subject vary, on the basis of resulting echo signals is known (refer to JP-A-61-191949, JP-A-62-268541 and JP-A-63-135145).

SUMMARY OF THE INVENTION

It has been found out, however, that optimization of the rf pulse becomes difficult if the portion of interest in the subject is small. For example, nuclear magnetic resonance signals from the portions around the portion of interest overlap with the nuclear magnetic resonance signal from the portion of interest, i.e. the selected portion, and since the signal quantities from the surrounding portions are great, optimization of the power of the rf pulse is effected for the surrounding portions having large signal quantities. If the portion of interest is the heart, for example, large quantities of signals from the skin around the heart overlap practically with the signal from the heart. Accordingly, there remains the problem that optimization of the rf pulse is effected for the skin but not for the heart.

It is therefore an object of the present invention to provide a method and apparatus which optimizes the rf pulse for the portion of interest.

It is another object of the present invention to provide a method and apparatus which can optimize the rf pulse with a high level of accuracy.

It is still another object of the present invention to provide a method and apparatus which can eliminate pseudo-echo signals and can thus improve optimization accuracy of the rf pulse.

The present invention prevents the occurrence of nuclear magnetic resonance signals from portions other than a portion of interest, i.e. a selected portion, of a sample, generates the nuclear magnetic resonance signal from the portion of interest while the occurrence of the nuclear magnetic resonance signals from the other portions is inhibited, and regulates the rf pulse applied to the sample to an optimum value on the basis of this signal.

Incidentally, since the flip angle of the spin is associated with the product of the irradiation time and amplitude of the rf pulse, regulation of the rf pulse is made for the irradiation time and/or amplitude of the rf pulse.

In accordance with one aspect of the present invention, a higher order echo among multiple echoes is utilized in order to regulate the rf pulse.

In accordance with another aspect of the present invention, the occurrence intervals of the multiple echoes are made mutually different.

According to the present invention, the occurrence of the nuclear magnetic resonance signals from portions of the sample other than a portion of interest is inhibited (e.g., suppressed or prevented) and under such a state, the nuclear magnetic resonance signal is generated from the portion of interest, i.e. the selected portion, of the sample and the irradiation time and/or amplitude of the rf pulse applied to the sample is regulated to a predetermined value on this basis of this signal. Consequently, the nuclear magnetic resonance signals from the portions of the sample other than the portion of interest are not involved at the time of the adjustment of the rf pulse and optimization of the rf pulse is effected for only the portion of interest.

The rf pulse which is optimized for only the portion of interest in the manner described above is irradiated to the sample, and the data formed on the basis of the nuclear magnetic resonance signal obtained from the sample, such as the image of the portion of interest in the case of MRI, for example, can be made clear and distinct.

The present invention utilizes a higher order echo among multiple echoes in order to regulate the rf pulse. The peak of the higher order echo is sharp and, hence, the peak maximum value can be detected highly accurately when the regulation of the rf pulse is made so that optimization accuracy of the rf pulse can be improved.

Furthermore, the present invention makes different the occurrence intervals of the multiple echoes. In this manner the overlap of the pseudo-echoes with the normal echo can be avoided and optimization of the rf pulse can thus be improved.

DESCRIPTION OF THE PREFERRED EMBODIMENTS

Figure 1:
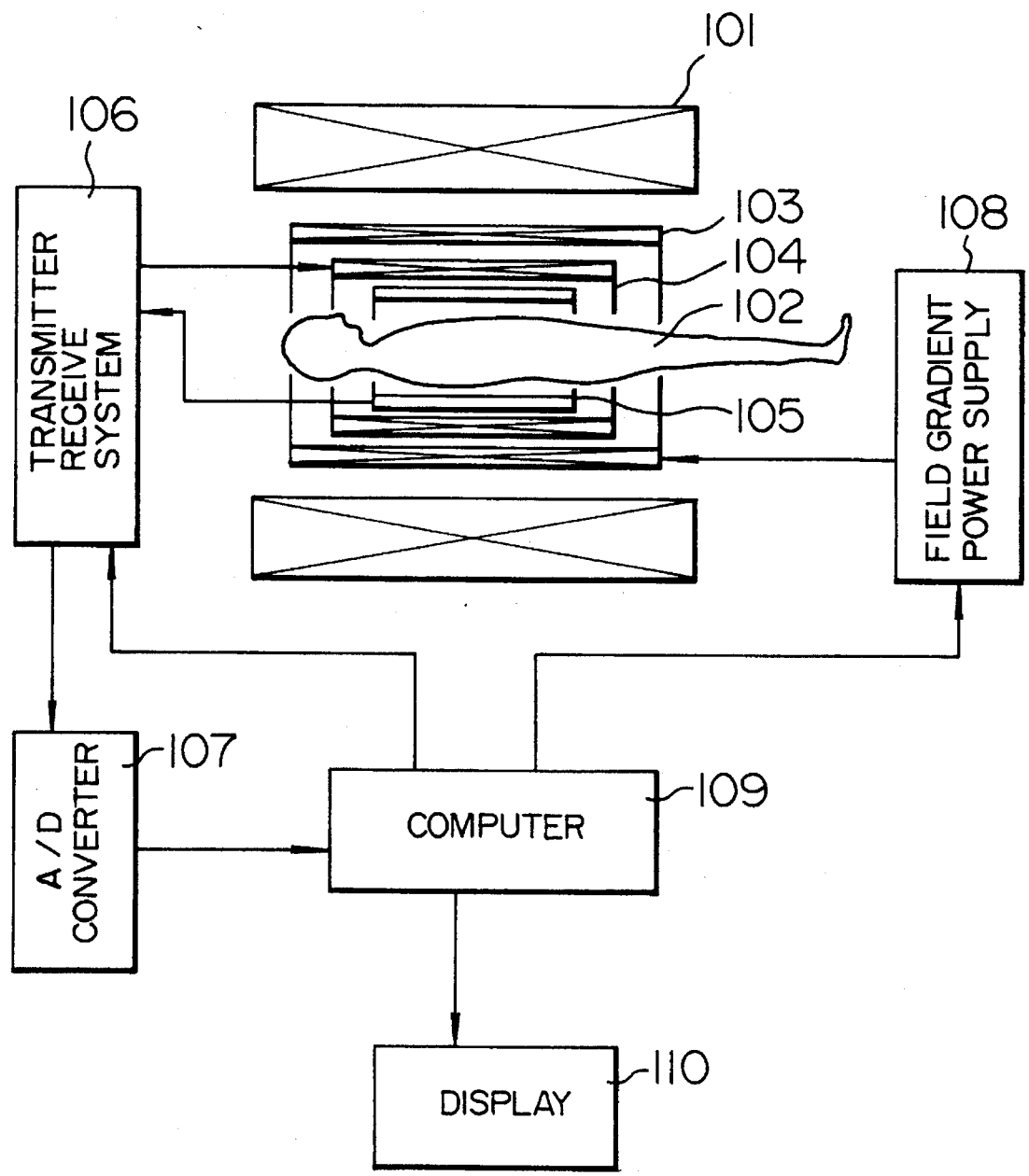
FIG. 1 is a block diagram showing a magnetic resonance imaging apparatus used for practicing an embodiment of the present invention.

Referring initially to FIG. 1, a subject 102 as a sample is placed in a magnet 101 for generating a uniform static field and a radio frequency pulse (rf pulse) necessary for generating a nuclear magnetic resonance phenomenon for a hydrogen atom nucleus in the subject is generated by a transmitter/receiver system 106. The rf pulse is irradiated to the subject 102 from a transmission coil 104. A nuclear magnetic resonance signal generated by the hydrogen atom nucleus in the subject is detected by a receiver coil 105 after the passage of a predetermined time and the detected signal is converted to an audio frequency by the transmitter/receiver system 106 and then to a digital signal by an A/D convertor 107. A computer 109 executes necessary image reconstruction operational processing of this digital signal and the resulting image is displayed on a display 110. The gradient field that is necessary for adding position data and flow velocity data required for imaging is applied by a gradient field power supply 108 which is in advance controlled by the computer 109 in such a manner as to satisfy predetermined necessary conditions and by a gradient field coil 103 which is driven by this power supply. The transmitter/receiver system 106, too, is controlled likewise by the computer.

Figure 2:
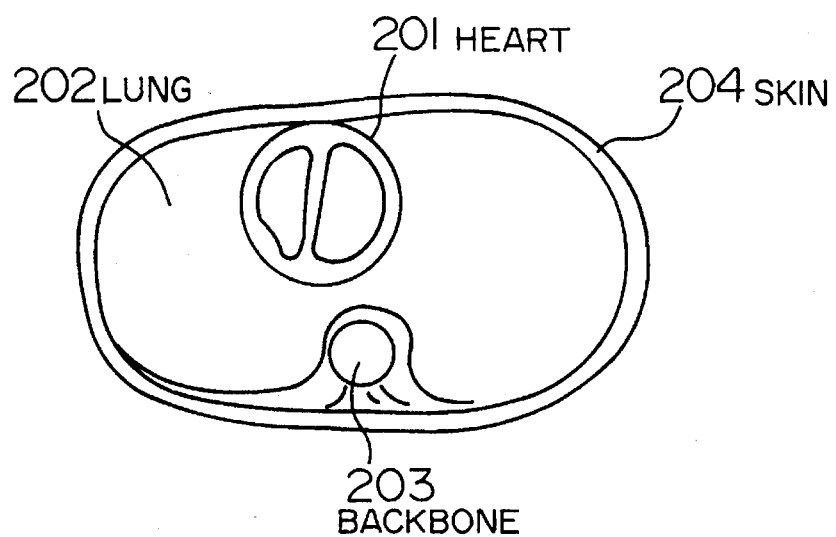
FIG. 2 is a schematic view showing an example of a magnetic resonance image.
Figure 3:
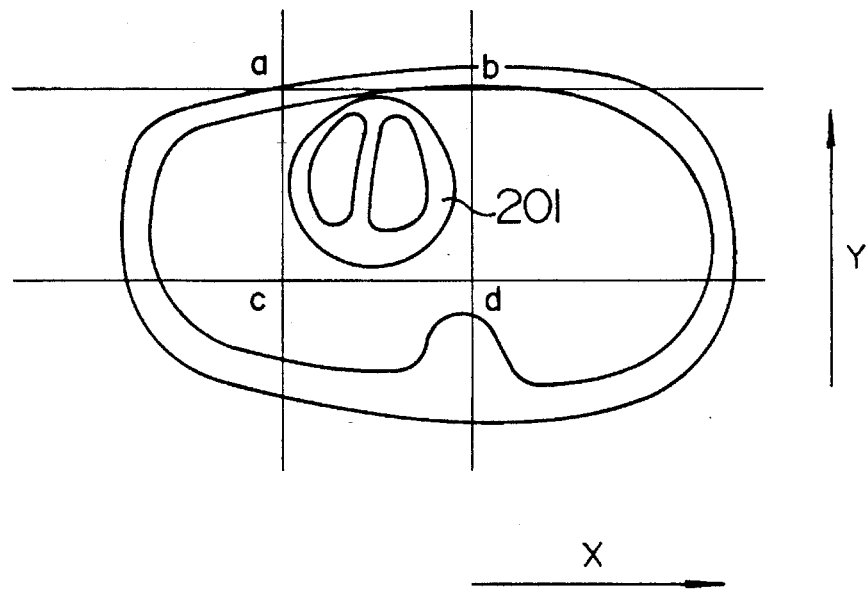
FIG. 3 is an explanatory view useful for explaining that part of the signal of the image shown in FIG. 3 is taken out.

FIG. 2 shows a tomogram of the chest obtained by the embodiment shown in FIG. 1, in which reference 201 denotes the heart, 202 is the lung, 203 is the backbone and 204 is the skin. When this tomogram of the chest is obtained in accordance with the prior art technology, the signal by the heart and the signal of the skin overlap with each other and since a radio frequency magnetic field is different depending on the location thereof, optimization takes place at the skin where the signal quantity is greater, so that the heart is not optimized. For this reason, the signals of the rest of portions, i.e. other than the heart which is encompassed by a,b,c and d, are eliminated so that only the signal of the heart can be obtained as shown in FIG. 3.

Figure 4:
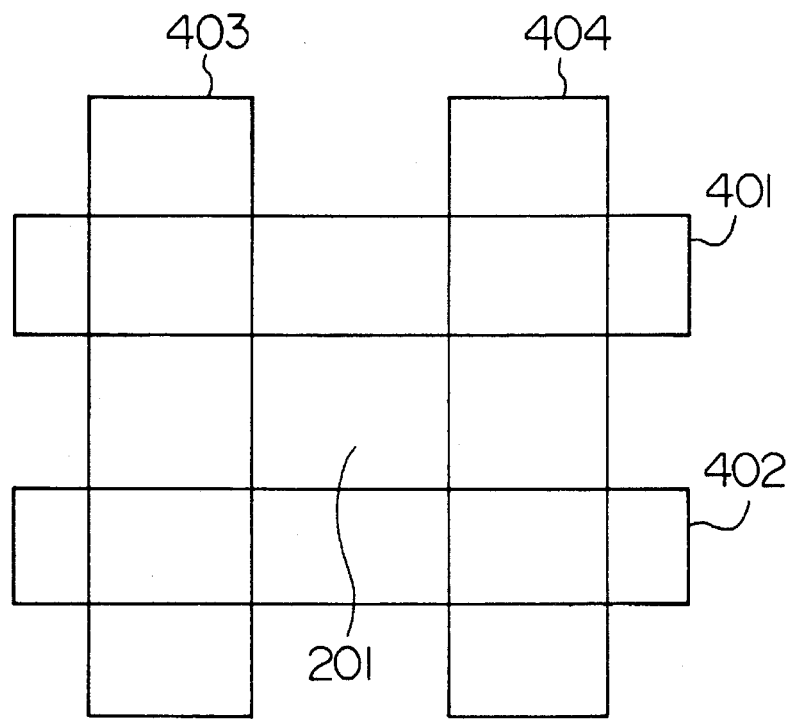
FIG. 4 is an explanatory view showing that portions other than the part shown in FIG. 3 are saturated.

In FIG. 4, the heart 201 is shown encompassed by rectangular portions 401 to 404. To begin with, the arrangement is made lest the signals are generated from these rectangular portions and under this state, the signal is then generated from the heart 201 encompassed by the rectangular portions. Optimization of amplitude of the rf pulse is carried out on the basis of this signal.

Figure 5:
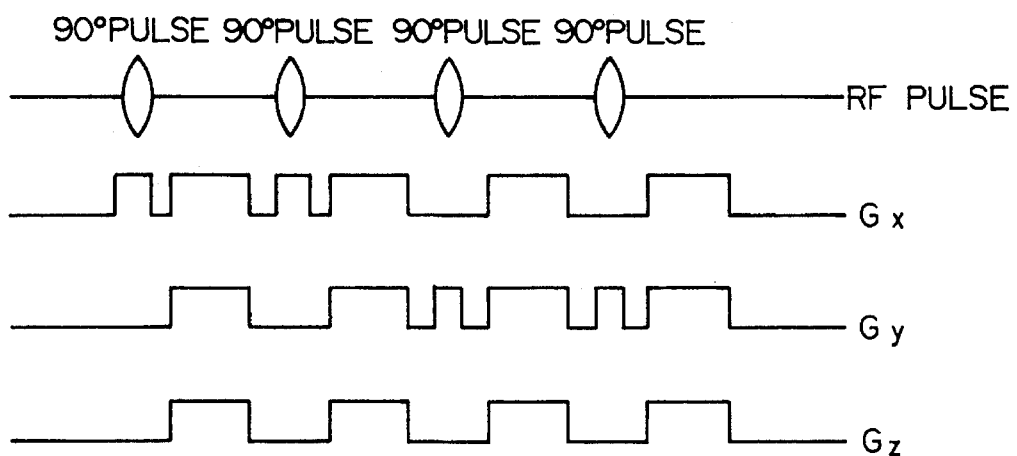
FIG. 5 is a diagram showing an example of the pulse sequence used for accomplishing the saturation shown in FIG. 4.

FIG. 5 shows a pulse sequence which is necessary in order not to generate the signals from the rectangular portions 401 to 404 shown in FIG. 4. As shown in the drawing, the rectangular portion 401 is excited by a first selective 90° pulse in the presence of a field gradient in an x direction and the phase of the spin in this portion is disturbed by subsequent field gradients Gx, Gy and Gz in x, y and z directions, so that this portion gets into saturation and a nuclear magnetic resonance signal is not generated from this portion. Similarly, the second, third and fourth rectangular portions 402–404 are caused to get into saturation by second, third and fourth selective 90° pulses and Gx, Gy and Gz, respectively, lest the nuclear magnetic resonance signals are generated from these portions.

Figure 6:
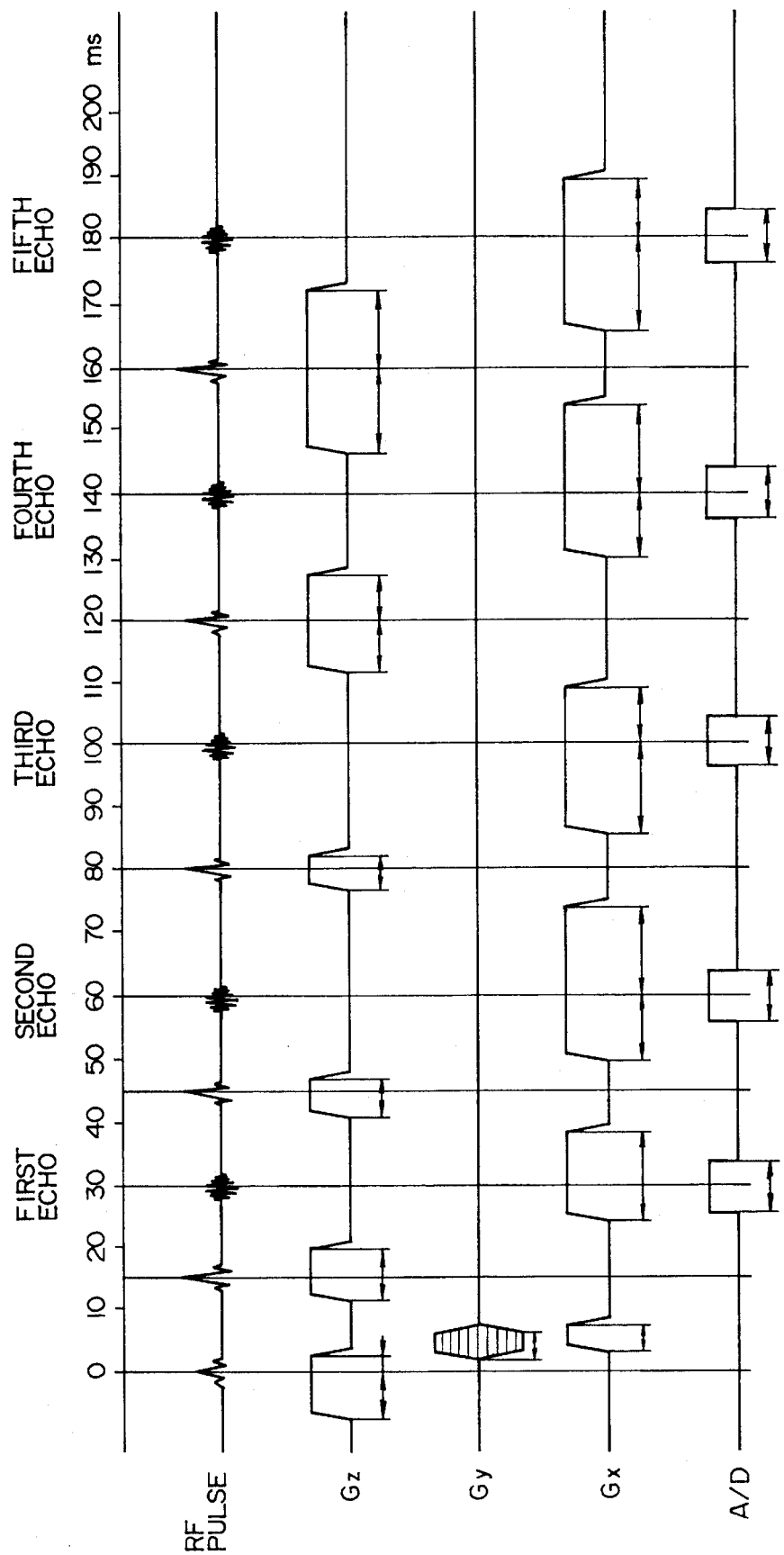
FIG. 6 is a diagram showing a pulse sequence of a multiple echo method.

FIG. 6 shows the pulse sequence of the multiple echo method used for obtaining the two-dimensional image of the heart 201 encompassed by the rectangular portions that are saturated in the manner described above. In other words, the pulse sequence shown in FIG. 6 is executed consecutively after the pulse sequence shown in FIG. 5. The abscissa represents the time (ms). Referring to the drawing, the selective rf 90° pulse is applied in the presence of the field gradient Gz in the z direction. Accordingly, a slice of the heart 201 is selected. In other words, the spin inside this slice is turned down by 90°. The slice thus turned down disperses gradually.

Subsequently, the selective rf 180° pulse is applied in the presence of Gz. As a result, the spin inside the slice reverses and the dispersed spins converge gradually, so that a first echo as the nuclear magnetic resonance signal is generated from the slices as a whole.

The field gradient Gy in the y direction for phase encoding is applied between the 90° pulse and the 180° pulse and the field gradient Gx in the x direction is further applied after the application of the 180° pulse. In the mean time, the echo generated from the slices as a whole is read out and subjected to the A/D conversion.

The steps described above are repeated N times in order to generate N echoes. However, Gy is changed everytime so that a time integration value changes at a predetermined ratio. N samplings are made for each of the N echoes and two-dimensional Fourier transform is applied to the N echoes each comprising N sampled signals in order to obtain the nuclear magnetic resonance image comprising N×N element images. There can be thus obtained the x - y two-dimensional image of the heart 201.

When the 180° pulses are thereafter applied repeatedly in the presence of Gz, higher order echoes such as the second and third order echoes are generated and they are read out by applying Gx and then subjected to A/D conversion, providing thus each higher order echo.

Figure 7:
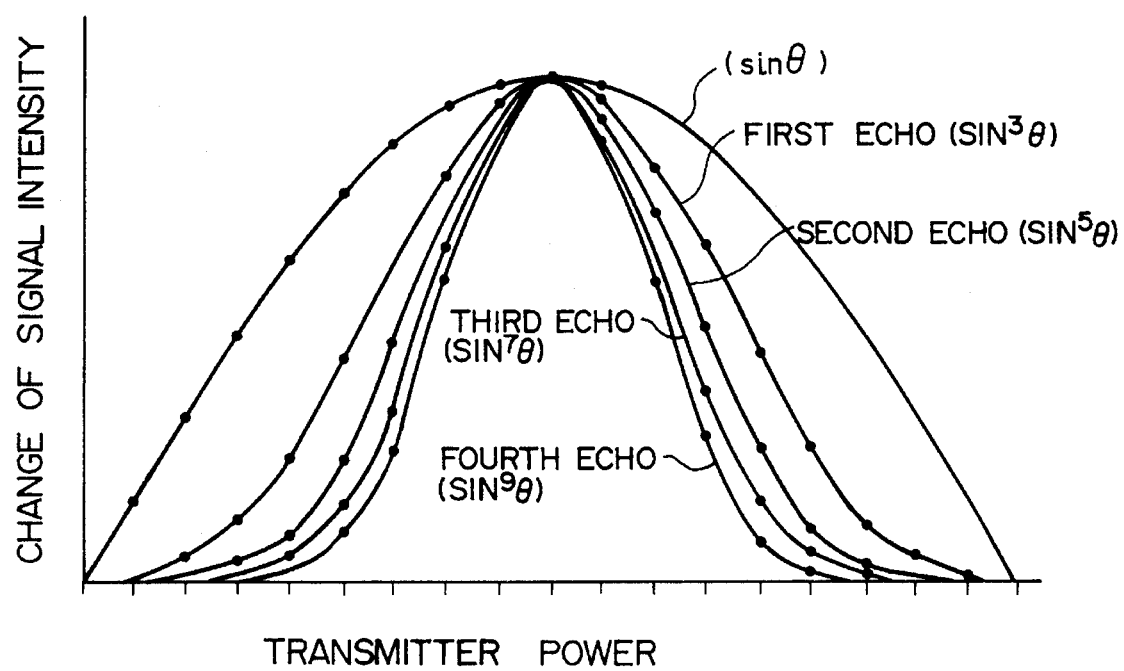
FIG. 7 is a diagram showing an echo waveform.

FIG. 7 shows the waveforms of the multi-echoes thus obtained. As is obvious from this drawing, the waveform becomes sharper with a higher order and this is advantageous for detecting accurately the maximum value (e.g., intensity or magnitude) of the echo when the amplitude of the rf pulse is optimized as will be described elsewhere. Accordingly, the present invention uses a higher order echo such as the fifth order echo shown in FIG. 6, for example.

Figure 8:
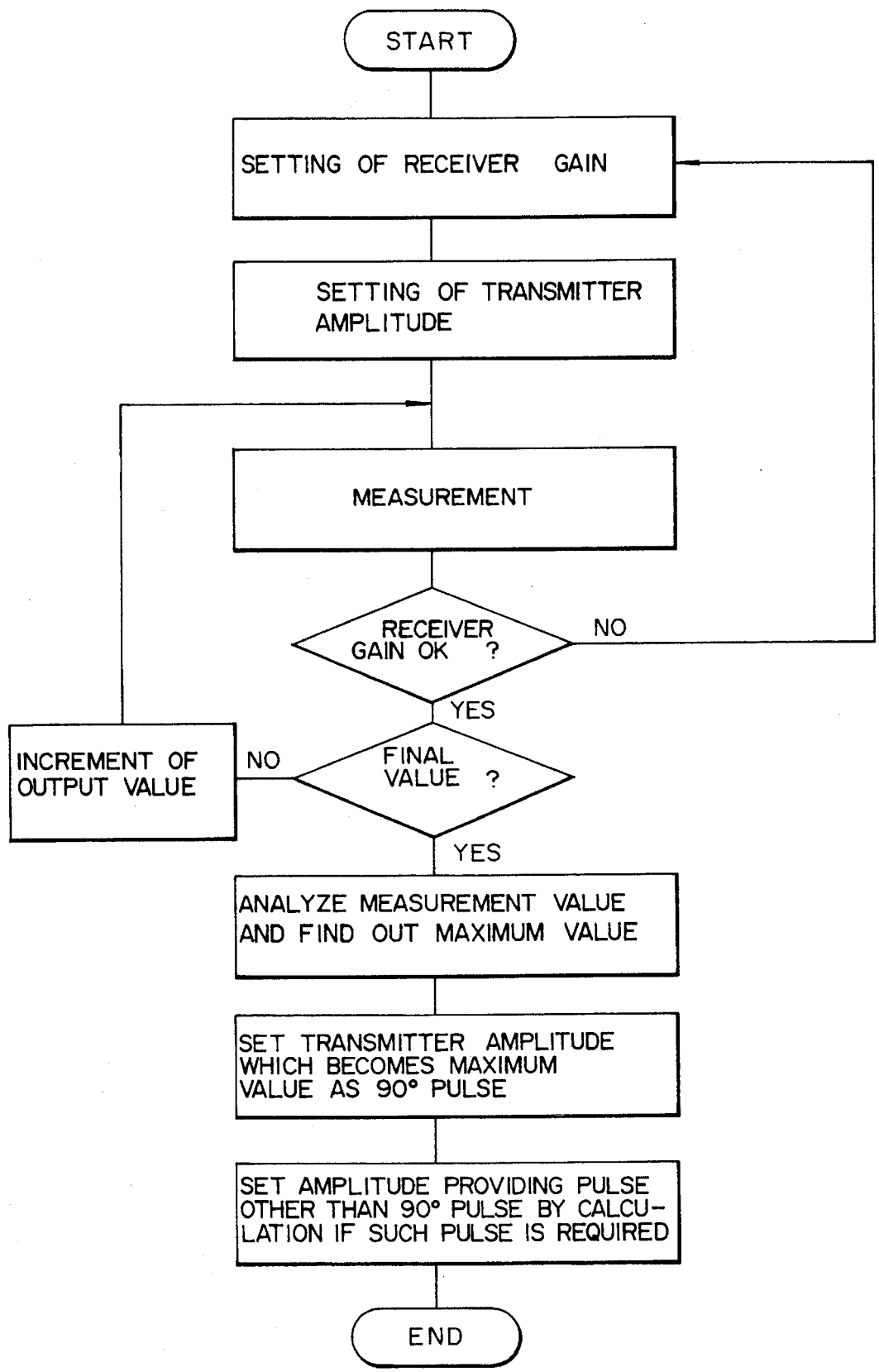
FIG. 8 is a flowchart for optimization of the amplitude of a radio frequency pulse.

FIG. 8 shows the flow chart for optimization of the amplitude of the rf pulse. Referring to the flowchart, the gain of the receiver for the nuclear magnetic resonance signal is first set and the the transmitter amplitude of the rf pulse is set. In other words, initial value, the final value and the gap are set at the beginning. Thereafter, measurement is carried out while the transmitter amplitude is changed at a set step and whether or not the receiver gain is appropriate is judged under this state. If the gain is not appropriate, the flow returns to the start. This procedure is repeated until a suitable gain is obtained. Then, whether or not the transmitter amplitude is the final value is judged and if it is not the final value, the output value is incremented and the measurement is repeated. When the transmitter amplitude reaches the final value, the measured value (see FIG. 7) is analyzed to find Rut the maximum value of the echo. A higher order echo is convenient for finding out this maximum value, as described already. When the maximum value is found out, the transmitter amplitude at that time is set as the transmitter amplitude of the 90° pulse. When pulses other than the 90° pulse, such as the 180° pulse, are required, the amplitude of the 180° pulse is determined by calculation and is then set.

The 180° pulse explained with reference to FIG. 6 is not always complete but is generally incomplete. Therefore, a pseudo-echo occurs in practice. This pseudo-echo is likely to occur on a higher order echo side and overlaps with the normal echo. Therefore, the pseudo-echo becomes the problem when the maximum value of an echo, especially that of a higher order echo, must be determined accurately. Refer to, for example, U.S. Pat. No. 4,866,386.

Although the higher order echo in the multiple echoes is suitable for the adjustment of the amplitude of the rf pulse due to its sharpness as described above, it is not free from the problem in that it is affected by the pseudo-echo.

This problem can be solved by changing the interval of the rf pulse or in other words, by changing the application timing, as shown in FIG. 6. In other words, the overlap of the pseudo-echo with the normal echo can be prevented by making the pulse intervals mutually different. The overlap of the pseudo-echo with the normal echo can be prevented, too, by changing the application period and application timing of the field gradient as shown in FIG. 6.

What is claimed is:

1. For a sample placed inside a static magnetic field in which a radio frequency pulse is irradiated to said sample and an image on the status of said sample is obtained on the basis of a nuclear magnetic resonance signal obtained thereby from said sample, a method of regulating said radio frequency pulse to be executed for obtaining the image, associated with said sample, comprising the steps of:

inhibiting occurrence of nuclear magnetic resonance signals from portions in a slice of said sample other than a selected portion of said slice including when said selected portion is associated with a relatively weaker NMR signal than NMR signals from other than said selected portion of said slice, said slice corresponding to a selected cross-section of said sample, wherein said selected portion of said slice is defined by a grid portion thereof corresponding to a plan view area of said slice surrounded by rectangular grid portions of said slice disposed to become saturated such that when said radio frequency pulse is irradiated to said sample the image to be formed is comprised from said selected portion in said slice;

generating said nuclear magnetic resonance signal from the selected portion in the slice of said sample under such a signal occurrence inhibition state; and regulating at least one of the irradiation time and amplitude of said radio frequency pulse so as to set a flip angle of a spin of said selected portion to a desired angle on the basis of said nuclear magnetic resonance signal generated from said selected portion.

2. A method of regulating a radio frequency pulse according to claim 1, wherein said nuclear magnetic resonance signal comprises an echo signal and at least one of the irradiation time and amplitude of said radio frequency pulse is regulated so as to obtain the same flip angle of a spin in the sample.

3. A method of regulating a radio frequency pulse according to claim 1, wherein said nuclear magnetic resonance signal comprises a relatively high order echo signal from among multiple echo signals.

4. A method of regulating a radio frequency pulse according to claim 1, wherein said nuclear magnetic resonance signal comprises a relatively high order echo signal from among multiple echo signals and at least one of the irradiation time and amplitude of said radio frequency pulse is regulated so that said relatively high order echo signal is substantially at maximum magnitude.

5. A method of regulating a radio frequency pulse according to claim 3, wherein said multiple echo signals are respectively generated at different timing intervals.

6. A method of regulating a radio frequency pulse according to claim 5, wherein said multiple echo signals are generated by irradiating said radio frequency pulses to said sample at irregular intervals.

7. A method of regulating a radio frequency pulse according to claim 5, wherein a field gradient is applied with said radio frequency pulse and the application timing of said field gradient is made different therefrom.

8. In an apparatus for obtaining image information on a sample placed in a static magnetic field by irradiating a radio frequency pulse to said sample, in which the apparatus regulates said radio frequency pulse on the basis of a nuclear magnetic resonance signal obtained thereby from said sample, said apparatus comprising:

means for inhibiting occurrence of nuclear magnetic resonance signals from portions in a slice of said sample other than from a selected portion in said slice including when said selected portion is associated with a relatively weaker NMR signal than NMR signals from other than said selected portion of said slice, said slice corresponding to a selected cross-section of said sample, wherein said selected portion of said slice is defined by a grid portion corresponding to a plan view area of said slice surrounded by rectangular grid portions of said slice disposed to become saturated such that when said radio frequency pulse is irradiated to said sample the image to be formed is comprised from said selected portion in said slice;

means for generating said nuclear magnetic resonance signal from said selected portion in said slice under such a signal occurrence inhibition state; and means for regulating at least one of the irradiation time and amplitude of said radio frequency pulse on the basis of said nuclear magnetic resonance signal so as to set a flip angle of a spin of said selected portion to a desired angle.

9. An apparatus for regulating a radio frequency pulse according to claim 8, wherein said nuclear magnetic resonance signal comprises an echo signal and at least one of the irradiation time and amplitude of said radio frequency pulse is regulated so as to obtain the same flip angle of a spin in the sample.

10. An apparatus for regulating a radio frequency pulse according to claim 8, wherein said nuclear magnetic resonance signal comprises a relatively high order echo signal from among multiple echo signals.

11. An apparatus for regulating a radio frequency pulse according to claim 8, wherein said nuclear magnetic resonance signal comprises a relatively high order echo signal from among multiple echo signals and at least one of the irradiation time and amplitude of said radio frequency pulse is regulated so that said relatively high order echo signal is substantially at maximum magnitude.

12. An apparatus for regulating a radio frequency pulse according to claim 10, wherein said multiple echo signals are respectively generated at different timing intervals.

13. An apparatus for regulating a radio frequency pulse according to claim 12, wherein said multiple echo signals are generated by irradiating said radio frequency pulses to said sample at irregular intervals.

14. An apparatus for regulating a radio frequency pulse according to claim 12, wherein a field gradient is applied with said radio frequency pulse and the application timing of said field gradient is made different therefrom.

* * * * *